(12) United States Patent
Takayama et al.

(10) Patent No.: US 8,917,567 B2
(45) Date of Patent: Dec. 23, 2014

(54) SEMICONDUCTOR DEVICE HAVING HIERARCHICAL BIT LINE STRUCTURE AND CONTROL METHOD THEREOF

(75) Inventors: Shinichi Takayama, Tokyo (JP); Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 312 days.

(21) Appl. No.: 13/313,731

(22) Filed: Dec. 7, 2011

(65) Prior Publication Data
US 2012/0147686 A1 Jun. 14, 2012

(30) Foreign Application Priority Data
Dec. 9, 2010 (JP) ................................. 2010-275163

(51) Int. Cl.
 G11C 7/02 (2006.01)
 G11C 11/4074 (2006.01)
 G11C 11/4097 (2006.01)
 G11C 11/4094 (2006.01)
 G11C 7/12 (2006.01)

(52) U.S. Cl.
 CPC ........ G11C 11/4097 (2013.01); G11C 11/4074 (2013.01); G11C 11/4094 (2013.01); G11C 7/12 (2013.01)
 USPC .......... 365/203; 365/51; 365/63; 365/185.25; 365/204; 365/227

(58) Field of Classification Search
 CPC .................................. G11C 7/12; G11C 7/18
 USPC ................. 365/203, 227, 51, 63, 185.25, 204
 See application file for complete search history.

(56) References Cited

U.S. PATENT DOCUMENTS

| | | | |
|---|---|---|---|
| 5,917,745 A | 6/1999 | Fujii | |
| 5,973,983 A * | 10/1999 | Hidaka | 365/230.03 |
| 6,133,781 A * | 10/2000 | Fujii et al. | 327/544 |
| 6,625,051 B2 * | 9/2003 | Sekiguchi et al. | 365/63 |
| 2006/0268656 A1 * | 11/2006 | Yokoyama | 365/233 |
| 2007/0242539 A1 * | 10/2007 | Ilda | 365/203 |

FOREIGN PATENT DOCUMENTS

JP 11-96750 A 4/1999

* cited by examiner

*Primary Examiner* — Tha-O H Bui
(74) *Attorney, Agent, or Firm* — Foley & Lardner LLP

(57) ABSTRACT

A semiconductor device includes a global bit line and a local bit line, and a switch coupled therebetween. Upon performing a precharge operation, a precharge voltage is supplied to the global bit line with turning the switch ON, so that the local bit line receives the precharge voltage through the global bit line and the switch, and after a lapse of a predetermined time, a precharge voltage is further supplied to the local bit line without an intervention of the global bit line and the switch.

20 Claims, 11 Drawing Sheets

SEMICONDUCTOR DEVICE HAVING HIERARCHICAL BIT LINE STRUCTURE AND CONTROL METHOD THEREOF

BACKGROUND OF THE INVENTION

1. Field of the Invention

The present invention relates to a semiconductor device comprising a memory cell array having a hierarchical bit line structure using global bit lines and local bit lines, and a control method thereof.

2. Description of Related Art

In recent years, miniaturization of semiconductor devices such as DRAM has been achieved, and thus it has been required to reduce memory cell size by, for example, using 4F2 (F is minimum manufacturing scale) cells. Meanwhile, the number of memory cells increases with the reduction in size of memory cells, and thus bit line capacitance increases, which causes performance problems. In order to overcome the problems, a memory cell array having a hierarchical bit line structure using global bit lines and local bit lines has been employed. In such a hierarchical memory cell array, when performing a precharge operation for a bit line, a local bit line and a global bit line that should be connected to a memory cell to be accessed need to be precharged to a predetermined precharge voltage. When a differential type sense amplifier is connected to one end of the global bit line, the precharge voltage is set to an intermediate potential between, for example, HIGH and LOW levels of a read signal. A specific example of the precharge operation in the hierarchical memory cell array is disclosed, for example, in Patent Reference 1.

[Patent Reference 1] Japanese Patent Application Laid-open No. 11-096750 (U.S. Pat. No. 5,917,745)

Generally, the hierarchical memory cell array has a typical configuration in which one global bit line corresponds to a plurality of local bit lines and wiring for each local bit line is formed in a wiring layer below a wiring layer for the global bit line. Reflecting this structure, precharge lines for transmitting the precharge voltage are formed, and a precharge voltage supply circuit for generating the precharge voltage is connected to a precharge line for the global bit line in an upper layer, which is branched therefrom into a plurality of lines being connected to precharge lines for the local bit lines in a lower layer through contacts and lines. In this structure, it is undesirable to form the precharge lines for the local bit lines in the upper layer since restriction in arranging a large number of the local bit lines causes an increase in area of the memory cell array.

However, the upper wiring layer can be formed of low-resistance metallic material such as aluminum or copper, and in contrast, the lower wiring layer has to be formed of high-resistance metallic material such as tungsten or polysilicon, and space restriction makes it difficult to widen a width of the precharge lines for the local bit lines. Thus, in the precharge operation for the local bit lines, the precharge voltage is supplied to the local bit lines through the precharge lines for the local bit lines having a parasitic resistance larger than that of the precharge lines for the global bit lines, which therefore causes current supply capability for precharging to be reduced. If the width of the precharge lines for the local bit lines is widened, the current from the precharge lines for the local bit lines is supplied from the precharge lines for the global bit line through the contacts, as described above, and therefore a contact resistance thereof also causes the current supply capability for precharging to be reduced. For example, Patent Reference 1 discloses an example of the precharge operation (FIG. 7), which clearly describes that precharge operations for the global bit line and the local bit line are simultaneously performed during a predetermined period and the global bit line and the local bit line are disconnected from each other during the precharge period. That is, precharge currents are supplied individually to the global bit lines and the local bit lines through corresponding precharge lines during the precharge period. Thus, the current supply capability for precharging a plurality of local bit lines is inevitably reduced. Therefore, the precharge operation for the local bit lines through the precharge lines of high resistance is delayed relative to the precharge operation for the global bit lines through the precharge lines of low resistance. Further, the precharge voltage of the precharge lines having a low current supply capability for the local bit lines largely varies from the predetermined precharge voltage due to the parasitic resistance thereof, and a recovery time until reaching the predetermined voltage generated by the precharge voltage supply circuit increases. A variation amount of the precharge voltage depends on data (1 or 0) that has been maintained by the respective local bit lines in a read or write operation. In the severest case, all the local bit lines have maintained either of 1 or 0. In this manner, in the precharge operation of the conventional memory cell array, there is a problem that it takes a long time to stabilize the local bit lines to the precharge voltage due to factors related to wiring layout, which causes a decrease in speed in the precharge operation.

SUMMARY

A semiconductor device according to an embodiment of the disclosure comprises: a first global bit line; a first local bit line corresponding to the first local bit line; a first hierarchical switch controlling an electrical connection between the first global bit line and the first local bit line; a sense amplifier amplifying a signal voltage of the first global bit line; a precharge voltage generating circuit generating a precharge voltage; a first precharge circuit supplying the precharge voltage to the first global bit line, the precharge voltage being supplied from the precharge voltage generating circuit through a first line; a second precharge circuit supplying the precharge voltage to the first local bit line, the precharge voltage being supplied from the precharge voltage generating circuit through a second line; and a control circuit controlling the first hierarchical switch, and the first and second precharge circuits. In the semiconductor device, in a precharge operation of the first local bit line and the first global bit line that are in a state of being electrically connected to each other through the first hierarchical switch, the control circuit activates the first precharge circuit so that the precharge voltage is supplied to the first global bit line through the first line and is supplied to the first local bit line through the global bit line and the first hierarchical switch, and after a lapse of a predetermined time, the control circuit activates the first precharge circuit so that the precharge voltage is supplied to the first local bit line through the second line. The predetermined time is set to a time necessary from activation of the first precharge circuit until a potential of the first local bit line converges to the precharge voltage.

A semiconductor device according to another embodiment of the disclosure comprises a global bit line, a local bit line, a plurality of memory cells each coupled to the local bit line, a first precharge circuit configured to supply, when activated, a first precharge voltage to the global bit line while turning the switch ON so that the local bit line is supplied with the first precharge voltage through the global bit line and the switch, and a second precharge circuit configured to supply, when activated, a second precharge voltage to the local bit line.

In a still another embodiment, there is provided a method comprising turning a switch ON to electrically connect a global bit line and a local bit line to each other, supplying a first precharge voltage to the global bit line so that the local bit line receives the first precharge voltage through the global bit line and the switch, and supplying a second precharge voltage to the local bit line after a predetermined period of time elapses from the supplying the first precharge voltage.

DETAILED DESCRIPTION OF THE PREFERRED EMBODIMENTS

It is apparent that the present invention is not limited to embodiments described below, but should be construed based on the disclosure of the claims.

Figure 1A:
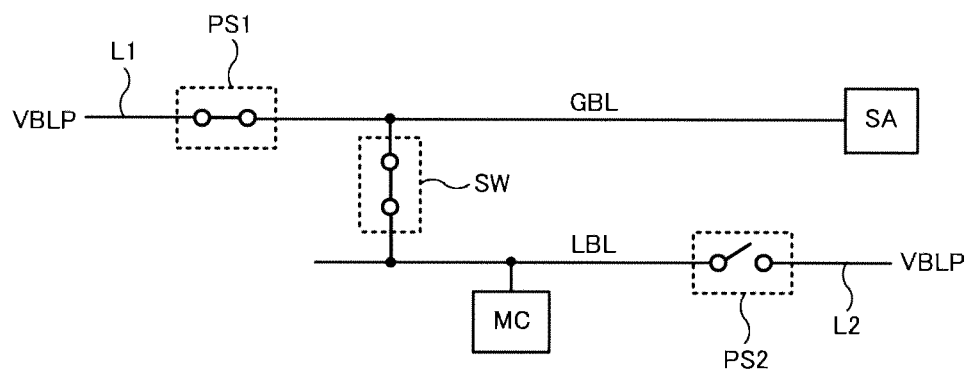
FIGS. 1A and 1B are diagrams showing an embodiment of the invention.
Figure 1B:
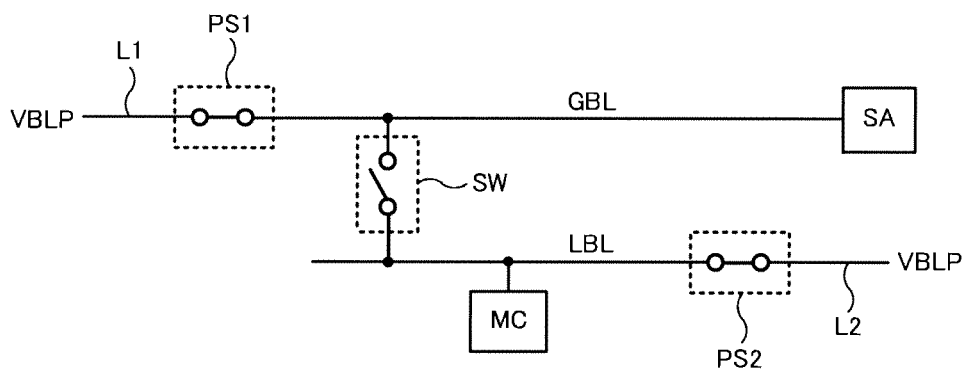

FIGS. 1A and 1B show an embodiment indicative of a semiconductor device that comprises a memory cell array with a hierarchical bit line structure. In the semiconductor device of FIG. 1, there are provided a global bit line GBL, a local bit line LBL, a hierarchical switch SW controlling an electrical connection between the global bit line GEL and the local bit line LBL, a sense amplifier SA amplifying a signal voltage of the global bit line GBL, a precharge switch PS1 (the first precharge circuit) supplying a precharge voltage VBLP, which is transmitted through a line L1, to the global bit line GBL, and a precharge switch PS2 (the second precharge circuit) supplying the precharge voltage VBLP, which is transmitted through a line L2, to the local bit line.

FIG. 1A shows a state of entering a precharge period after an active period for accessing memory cells MC ends. At this point, the hierarchical switch SW remains in a conductive state (on), and thus the global bit line GEL and the local bit line are in a state of being connected to each other. In this state, by turning on the precharge switch PS1, the precharge voltage VBLP is supplied to the global bit line GBL through the line L1. At this point, the precharge switch PS2 for the local bit line LBL remains in a non-conductive state (off). Thereby, the precharge voltage VBLP is supplied from the global bit line GBL to the local bit line through the hierarchical switch SW being in an ON state.

FIG. 1B shows a state after a predetermined time elapses from the time point in FIG. 1A. The predetermined time is set to a time necessary from the time point in FIG. 1A until the potential of the local bit line LBL almost converges to the precharge voltage VBLP. At this point, the global bit line GBL and the local bit line are disconnected from each other by turning off the hierarchical switch SW, and the precharge voltage VBLP is supplied to the local bit line through the line L2 by turning on the precharge switch PS2. Although FIG. 1B shows a case of turning off the hierarchical switch SW, the hierarchical switch SW can remain on. After the time point in FIG. 1B, the precharge switch PS2 functions as an assisting circuit and a level keeper for the local bit line LBL. The above-described control enables a high-speed precharge operation without being affected by a resistance of the line L2 or by current supplying capability of the precharge switch PS2 since the precharge switch PS2 is not used in the precharge operation. This high-speed precharge operation can be achieved even when the line L2 for the local bit line LBL has a resistance higher than that of the line L1 of the global bit line GBL due to restriction of wiring space or wiring layers, or even when the current supplying capability of the precharge switch PS2 is smaller than that of the precharge switch PS1.

Figure 2:
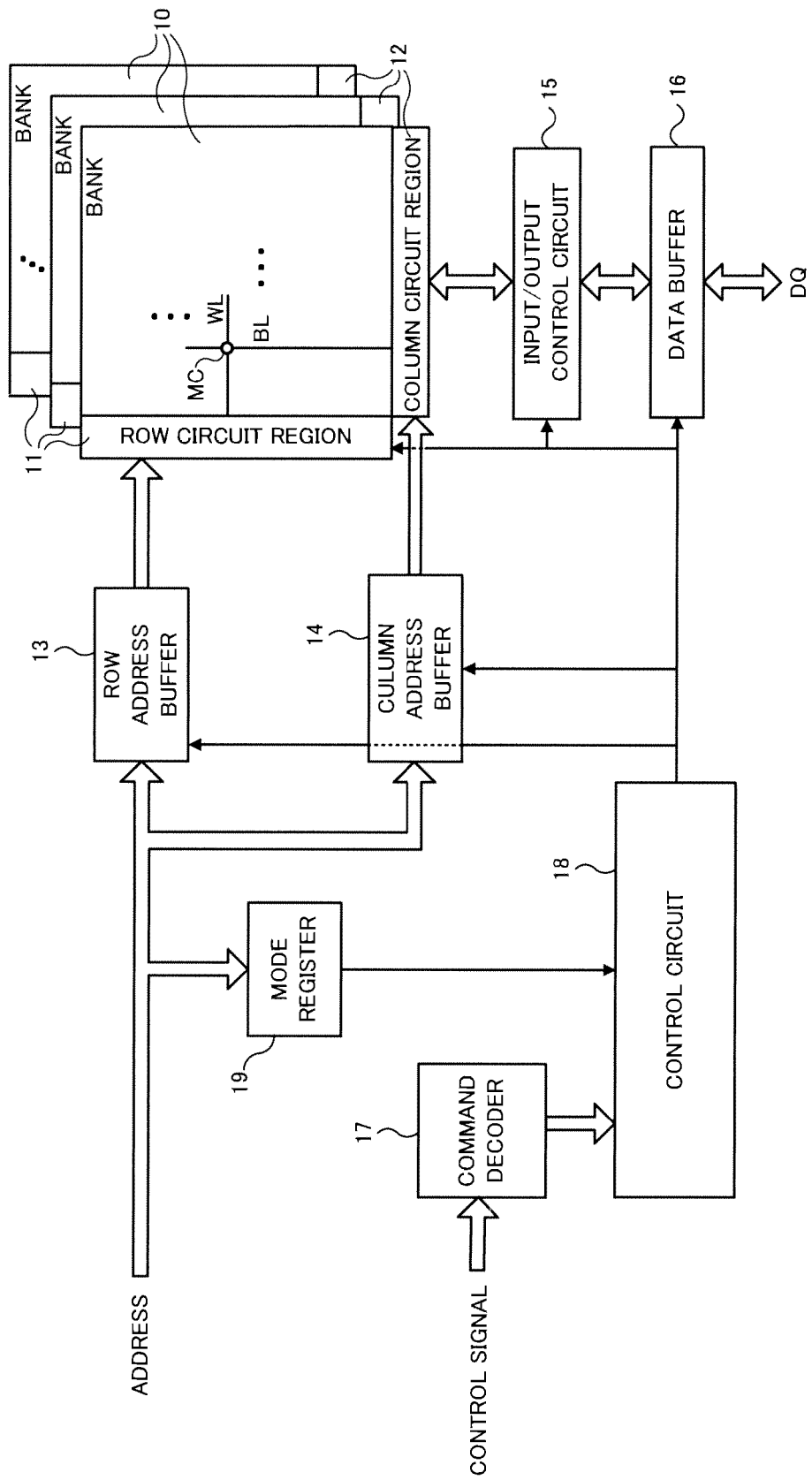
FIG. 2 is a block diagram showing an entire configuration of a DRAM of the embodiment.

Further embodiments will be described in the followings. FIG. 2 is a block diagram showing an entire configuration of a DRAM of the embodiment. In the DRAM shown in FIG. 2, there are provided a memory cell array region 10 including a plurality of memory cells MC arranged at intersections of a plurality of word lines WL and a plurality of bit lines BL, and a row circuit region 11 and a column circuit region 12 that are attached to the memory cell array region 10. The memory cell array region 10 is divided into a plurality of memory banks BANK. As described later, the bit lines BL included in the memory cell array region 10 are hierarchized into global bit lines GBL of an upper hierarchy and local bit lines LBL of a lower hierarchy. The row circuit region 11 includes a large number of circuits provided corresponding to the plurality of word lines WL, and the column circuit region 12 includes a large number of circuits provided corresponding to the plurality of bit lines BL. Further, the memory cell array region 10 includes hierarchical switches SW and sense amplifiers SA that are associated with the bit lines BL.

Addresses supplied from outside the DRAM include a row address and a column address, the row address is stored in a row address buffer 13 and sent to the row circuits 11, and the column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ). A command decoder 17 determines a command for the DRAM based on externally received control signals and sends the command to a control circuit 18. The control circuit 18 controls operations of respective parts of the DRAM according to a command type determined by the command decoder 17. The control circuit 18 outputs control signals for controlling later-mentioned hierarchical switches and precharge circuits. A mode register 19 selectively sets operation modes of the DRAM based on the above addresses and sends setting information to the control circuit 18.

Figure 3:
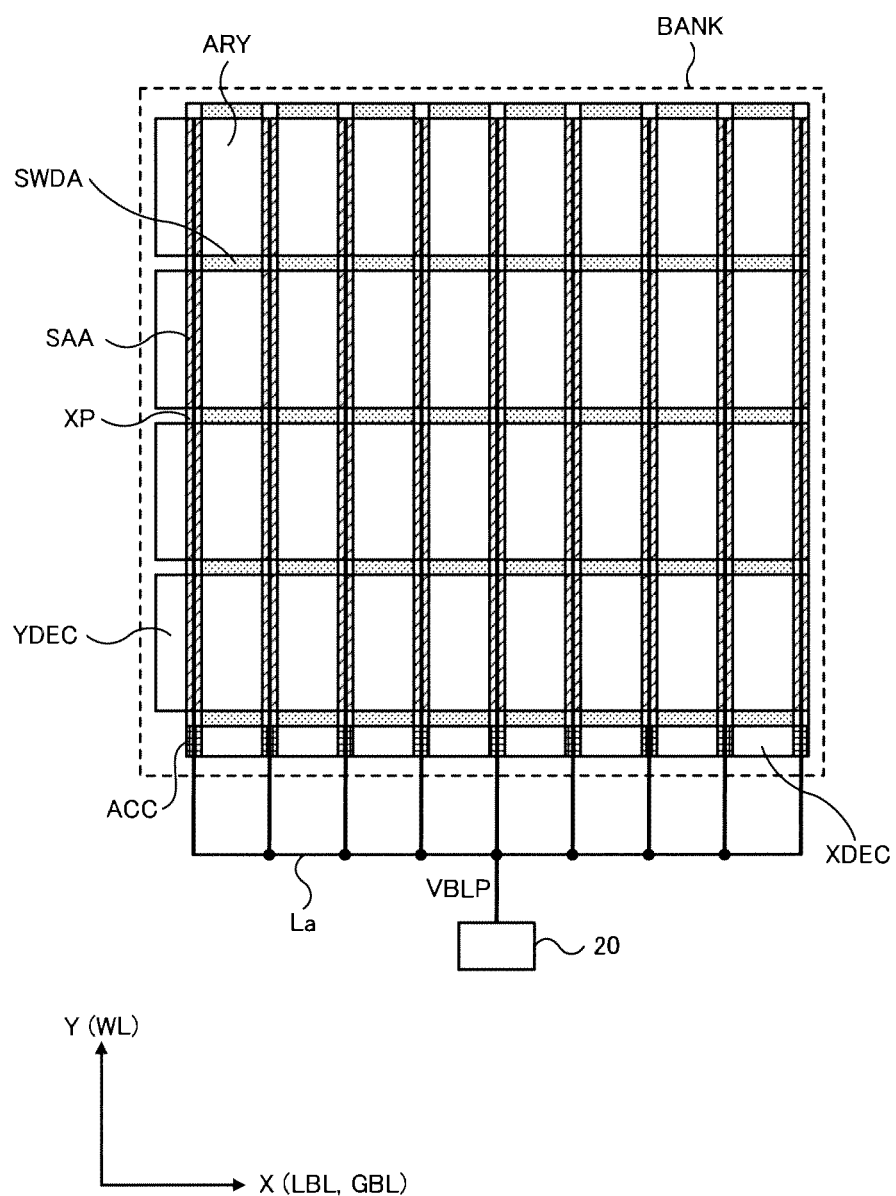
FIG. 3 is a block diagram showing a configuration of each memory bank of FIG. 2.

FIG. 3 is a block diagram showing a configuration of the memory bank BANK of FIG. 2. X and Y directions perpendicular to each other are shown with arrows for convenience in the lower side of FIG. 3. The X direction is an extending direction of the global bit lines GBL and the local bit lines LBL, which will be described later, and the Y direction is an extending direction of the word lines WL. A plurality of memory cell arrays ARY are arranged in a matrix form in the memory bank BANK. On the periphery of each memory cell array ARY, a sense amplifier array SAA including a plurality of sense amplifiers SA (described later in FIG. 4) is disposed at an end in the X direction, and a sub-word driver array SWDA including a plurality of sub-word drivers is disposed at an end in the Y direction. A cross area XP is disposed in a circuit area where the sub-word driver array SWDA and the sense amplifier array SAA intersect each other. In an outer periphery of the memory bank BANK, a Y decoder YDEC is disposed at an end in the X direction, and an X decoder XDEC and an array control circuit ACC are disposed at an end in the Y direction. Operations of these elements will be described in detail later.

Further, a VBLP generating circuit 20 generating the precharge voltage VBLP to be supplied to circuit blocks such as sense amplifier arrays SAA is disposed outside the memory bank BANK, as shown in FIG. 3. The precharge voltage VBLP outputted from the VBLP generating circuit 20 is supplied to precharge lines provided in the sense amplifier arrays SAA through a line La as a main line. The precharge lines will be described later using FIGS. 6 to 8. Also, in precharge operation using the precharge voltage VBLP will be described later.

Figure 4:
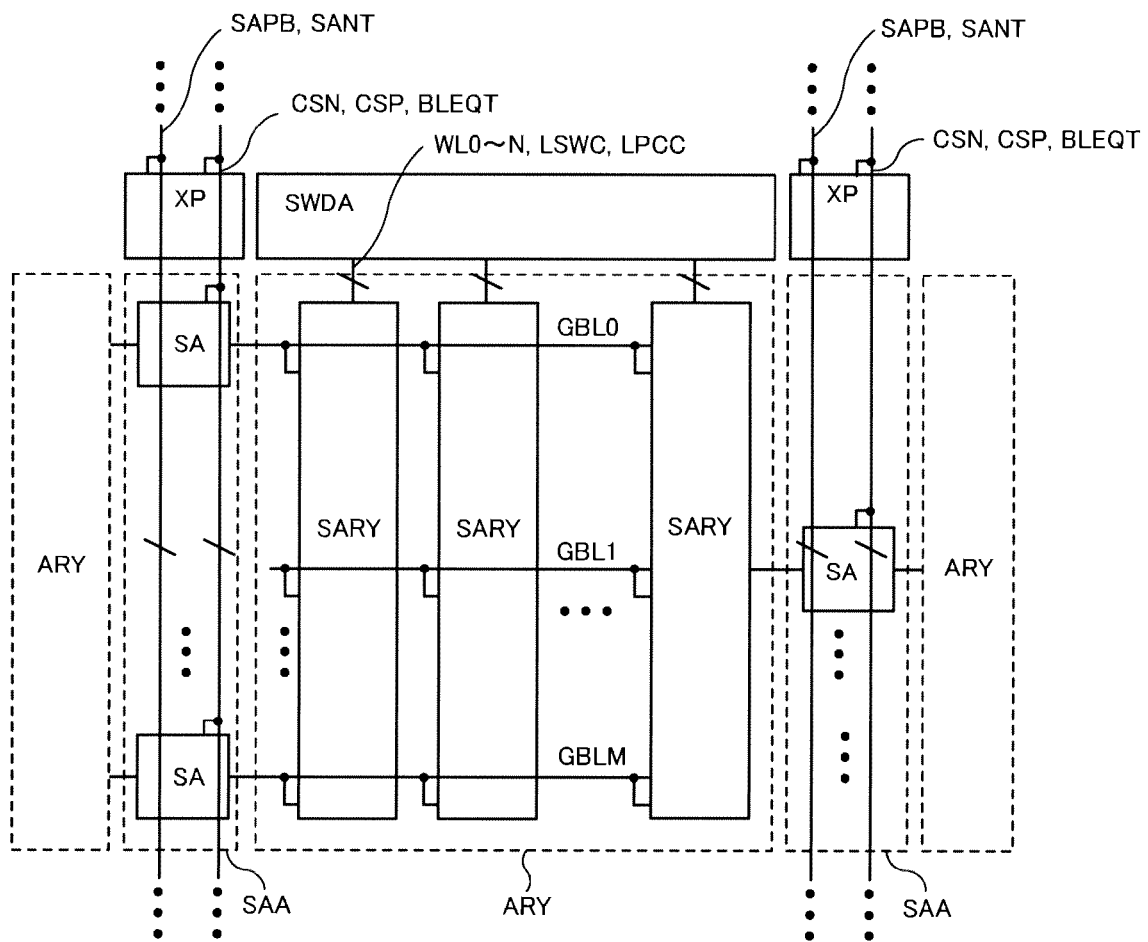
FIG. 4 is a block diagram showing a partial configuration of FIG. 3.

FIG. 4 is a block diagram showing a partial configuration of FIG. 3, which corresponds to a range including one memory cell array ARY and its periphery. The above-mentioned precharge lines are not shown in FIG. 4. As shown in FIG. 4, the memory cell array ARY is segmented into a plurality of sub-arrays SARY aligned in the X direction (bit line extending direction). In the example of FIG. 4, M+1 global bit lines GBL (GBL0 to GBLM) extend over the plurality of sub-arrays SARY. That is, each global bit line GBL is capable of being connected to local bit lines LBL included in all the sub-arrays SARY via later-described hierarchical switches. The configuration of FIG. 4 has a so-called open bit line structure. That is, each sense amplifier SA is a differential amplifier that amplifies a voltage difference between a signal voltage of one global bit line GBL (the first global bit line) in the memory cell array ARY and a signal voltage of one global bit line GBL (the second global bit line) in another memory cell array ARY symmetrically arranged across the sense amplifier array SAA. As described later, a pair of local bit lines LBL (the first and second local bit lines) corresponding to a pair of global bit lines GBL that are connected to the sense amplifier SA is selected. Further, the M+1 global bit lines GBL are alternately connected to sense amplifiers SA of the sense amplifier arrays SAA on both sides in the arrangement order. In addition, various signals are supplied to the sense amplifier arrays SAA on both sides, and specific roles of the signals will be described later.

Figure 5:
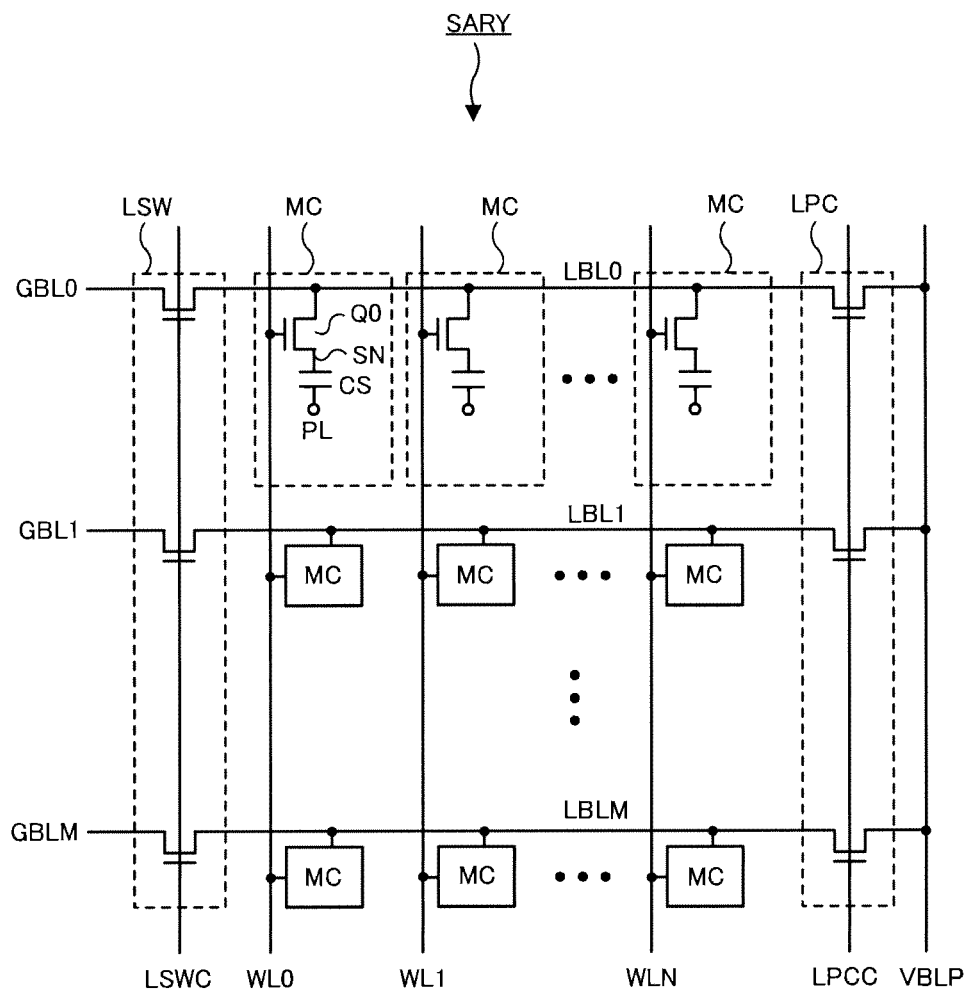
FIG. 5 is a block diagram showing a circuit configuration example of a sub-array of FIG. 4.

FIG. 5 shows a circuit configuration example of the sub-array SARY of FIG. 4. M+1 local bit lines LBL (LBL0 to LBLM) of a lower hierarchy corresponding to the M+1 global bit lines GBL (GBL0 to GBLM) of an upper hierarchy are arranged in the sub-array SARY. In a multilayer structure on a semiconductor substrate, normally, a wiring layer for the global bit lines GBL is formed over a wiring layer for the local bit lines LBL. N+1 memory cells MC formed at intersections of N+1 word line WL (WL0 to WLN) and each local bit line LBL to which the memory cells MC are connected. Thus, in the example of FIG. 5, (M+1)×(N+1) memory cells MC are arranged in the sub-array SARY. Each memory cell MC is composed of a select transistor Q0 that is selectively switched by a word line WL, and a capacitor CS storing data as electric charge at a data storage node SN, and a plate voltage VPLT is supplied to the capacitor CS.

Switch circuits LSW include M+1 NNOS transistors arranged between the M+1 local bit lines LBL and the M+1 global bit lines GBL. Each NMOS transistor in the switch circuits LSW functions as a hierarchical switch controlling a connection state between the global bit line GBL and the local bit line LBL in response to a connection control signal LSWC applied to its gate. The connection control signal LSWC is generated by the X decoder XDEC and is transmitted to the switch circuits LSW through repeaters in the sub-word driver array SWDA. When the connection control signal LSWC is set to HIGH, the NMOS transistors in the switch circuits LSW turn on, and the M+1 local bit lines LBL are connected to the M+1 global bit lines GBL. In addition, one local bit line LBL belonging to a selected one of the plurality of sub-arrays SARY aligned in the Y direction is selectively connected to each one of the global bit lines GBL.

Precharge circuits LPC (the second precharge circuits) include M+1 NNOS transistors connected to one ends of the M+1 local bit lines LBL. Each NMOS transistor in the precharge circuits LPC functions as a precharge switch precharging the local bit line LBL to the precharge voltage VBLP in response to a precharge signal LPCC applied to its gate. The precharge signal LPCC is generated by the X decoder XDEC and is transmitted to the precharge circuits LPC through repeaters in the sub-word driver array SWDA. When the precharge signal LPCC is set to HIGH, the NMOS transistors in the switch circuits LSW turn on, and the M+1 local bit lines LBL are precharged to the precharge voltage VBLP. In addition, the precharge voltage VBLP is set to an intermediate potential between a high-level potential (data "1") and a low-level potential (data "0") of the local bit lines LBL during an active period.

Figure 6:
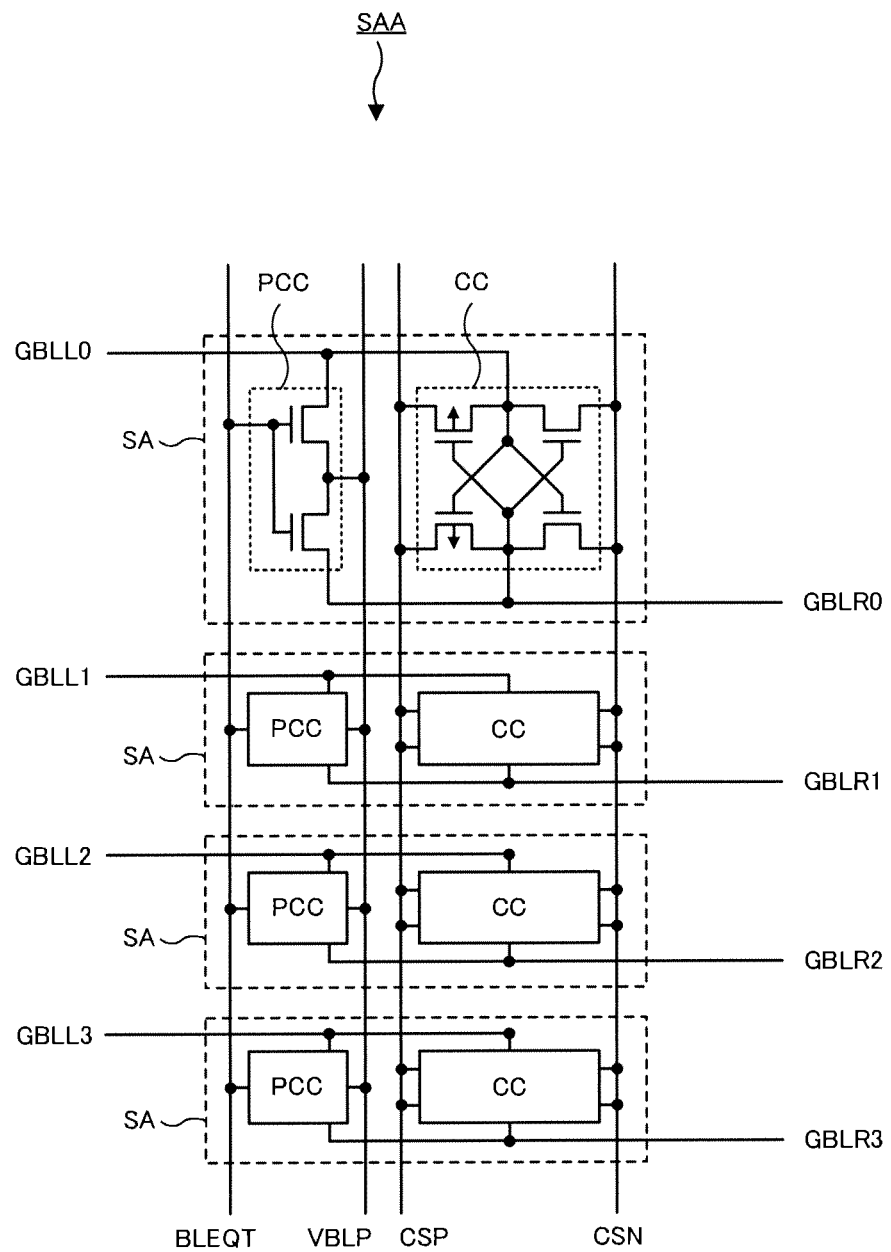
FIG. 6 is a diagram showing a circuit configuration example of a sense amplifier array of FIG. 4.

FIG. 6 shows a specific circuit configuration example of the sense amplifier array SAA of FIG. 4. The example of FIG. 6 includes four global bit lines GBL (GBLL0 to GBLL3) on the left and four global bit lines GBL (GBLR0 to GBLR3) on the right, which corresponds to a range including four sense amplifiers SA. Each sense amplifier SA is connected to a pair of global bit lines GBL on both sides and includes a precharge circuit PCC and a cross-coupled circuit CC. The precharge voltage VBLP is supplied through the line La. A column switch and a data bus that selectively connect the global bit lines GBL to the input/output control circuit 15 (FIG. 2) are not shown in FIG. 6.

The precharge circuit PCC (the first precharge circuit) is composed of a pair of NMOS transistors precharging a pair of global bit lines GBL to the precharge voltage VBLP in response to a bit line equalization signal BLEQT. The cross-coupled circuit CC is composed of an inverter receiving a signal of the global bit line GBL on the left and an inverter receiving a signal of the global bit line GBL on the right, in which inputs and outputs of the inverters are cross-coupled to each other, and the cross-coupled circuit CC determines a voltage difference between the pair of global bit lines GBL in a binary manner and latches it. In the cross-coupled circuit CC, a common source line CSP is connected to sources of the two PNOS transistors, and a common source line CSN is connected to sources of the two NNOS transistors.

Figure 7:
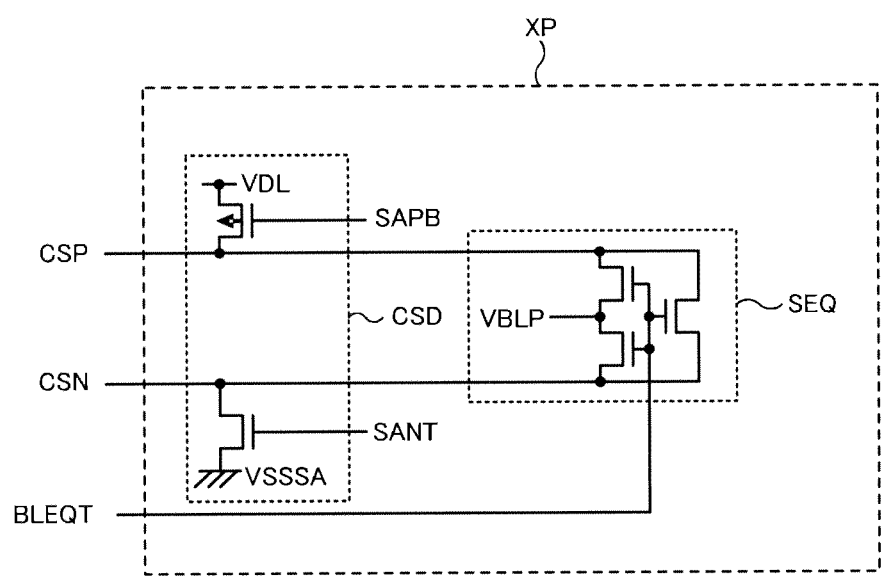
FIG. 7 is a diagram showing a partial circuit configuration example of a cross area of FIG. 4.

FIG. 7 shows a partial circuit configuration example of the cross area XP of FIG. 4. In FIG. 7, a driver circuit CSD and an equalization circuit SEQ are shown as a circuit potion for controlling a pair of the common source lines CSP and CSN supplied to the cross-coupled circuit CC of FIG. 6. The driver circuit CSD is composed of a PMOS transistor supplying a power supply voltage VDL to the common source line CSP in response to a control signal SAPS, and an NMOS transistor supplying a ground potential VSSSA to the common source line CSN in response to a control signal SANT. Further, the equalization circuit SEQ is composed of three NMOS transistors precharging the pair of common source lines CSP and CSN to the precharge voltage VBLP and equalizing them. The precharge voltage VBLP of FIG. 7 is supplied through the line La.

Figure 8:
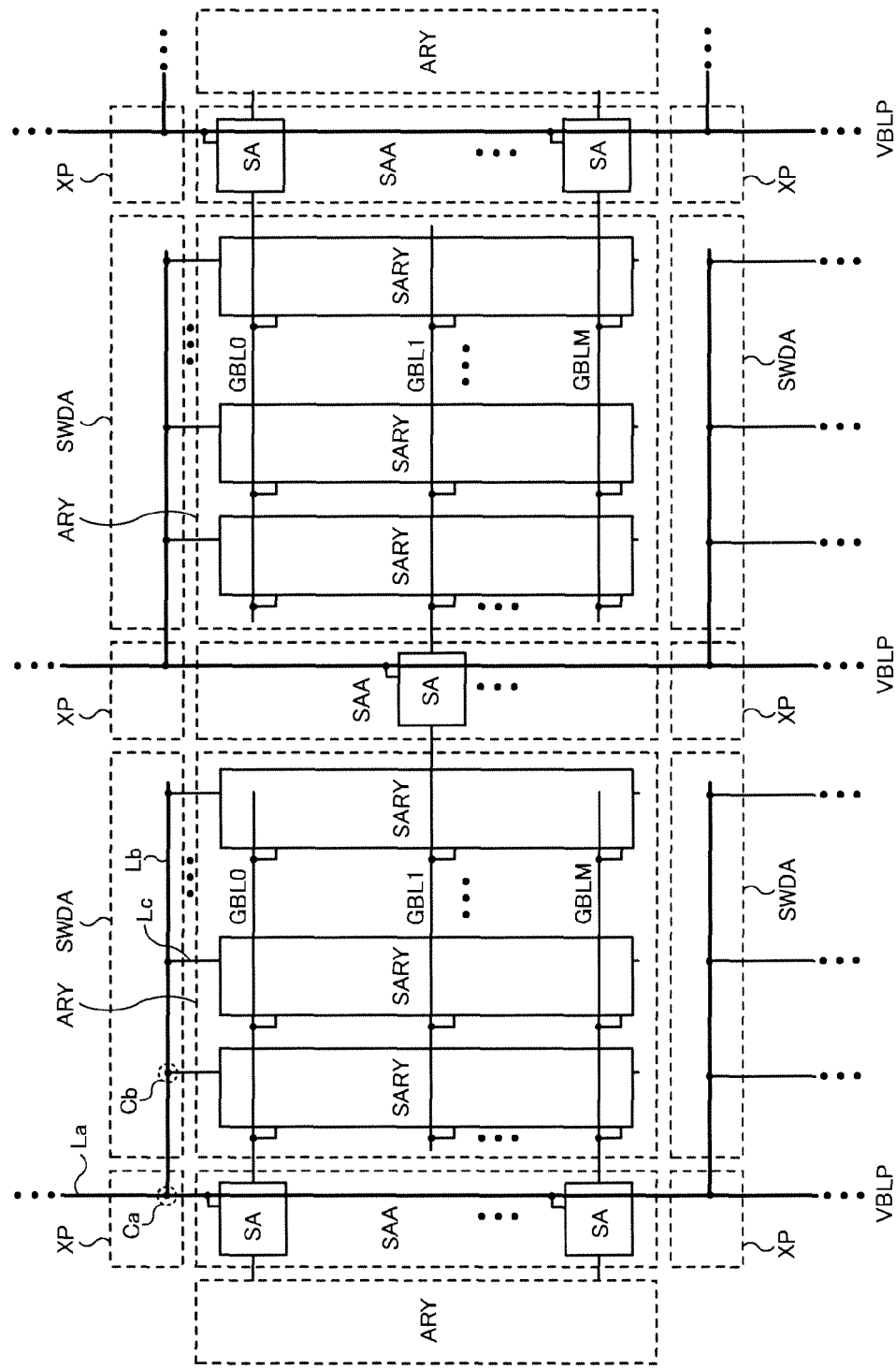
FIG. 8 is a diagram showing an example of a wiring layout for supplying a precharge voltage in the DRAM of the embodiments.

FIG. 8 shows an example of a wiring layout for supplying the precharge voltage VBLP in the DRAM of the embodiments. As shown in FIG. 8, lines of the precharge voltage VBLP are arranged in a range including the memory cell array ARY, and the sense amplifier array SAA, the sub-word driver array SWDA and the cross area XP that are on the periphery of the memory cell array ARY, and the lines include the line La (FIG. 3), the line Lb, and the lines Lc. The line La extends from the VBLP generating circuit 20 to the sense amplifier array SAA along the Y direction, as described in FIG. 3. The precharge voltage VBLP is supplied through the line La to the precharge circuits PCC (FIG. 6) of the respective sense amplifiers SA. The line La is connected to the line Lb through a contact Ca in the cross area XP. The line Lb extends to the sub-word driver array SWDA along the X direction (a direction parallel to the global bit lines GBL). These lines La and Lb are made of metallic material of low resistance such as aluminum and copper.

Meanwhile, the line Lb is connected to the lines Lc in a lower layer through a large number of contacts Cb in the sub-word driver array SWDA. The lines Lc extend from the sub-word driver array SWDA to each sub-array SARY along the Y direction (a direction parallel to the word lines WL). In this manner, a large number of the lines Lc are branched from one line Lb. However, each line Lc has a length shorter than that of the line La. The lines Lc are made of material having a resistivity (parasitic resistance value per length) higher than those of the lines La and Lb, and materials such as tungsten, polysilicon, polycide, diffusion layer, silicide, titanium, titanium nitride, and a combination of these materials are used. Thus, the precharge voltage VBLP supplied from the precharge circuits PCC is transmitted to the precharge circuits LPC (FIG. 5) in the sub-array SARY through the line La, the contact Ca, the line Lb, the contacts Cb and the lines Lc in this order. In the sub-array SARY, the lines Lc for the precharge voltage VBLP are formed in a wiring layer below the wiring layer for the global bit lines GBL, and is in a positional relation of being perpendicular to the global bit lines GBL.

Figure 9:
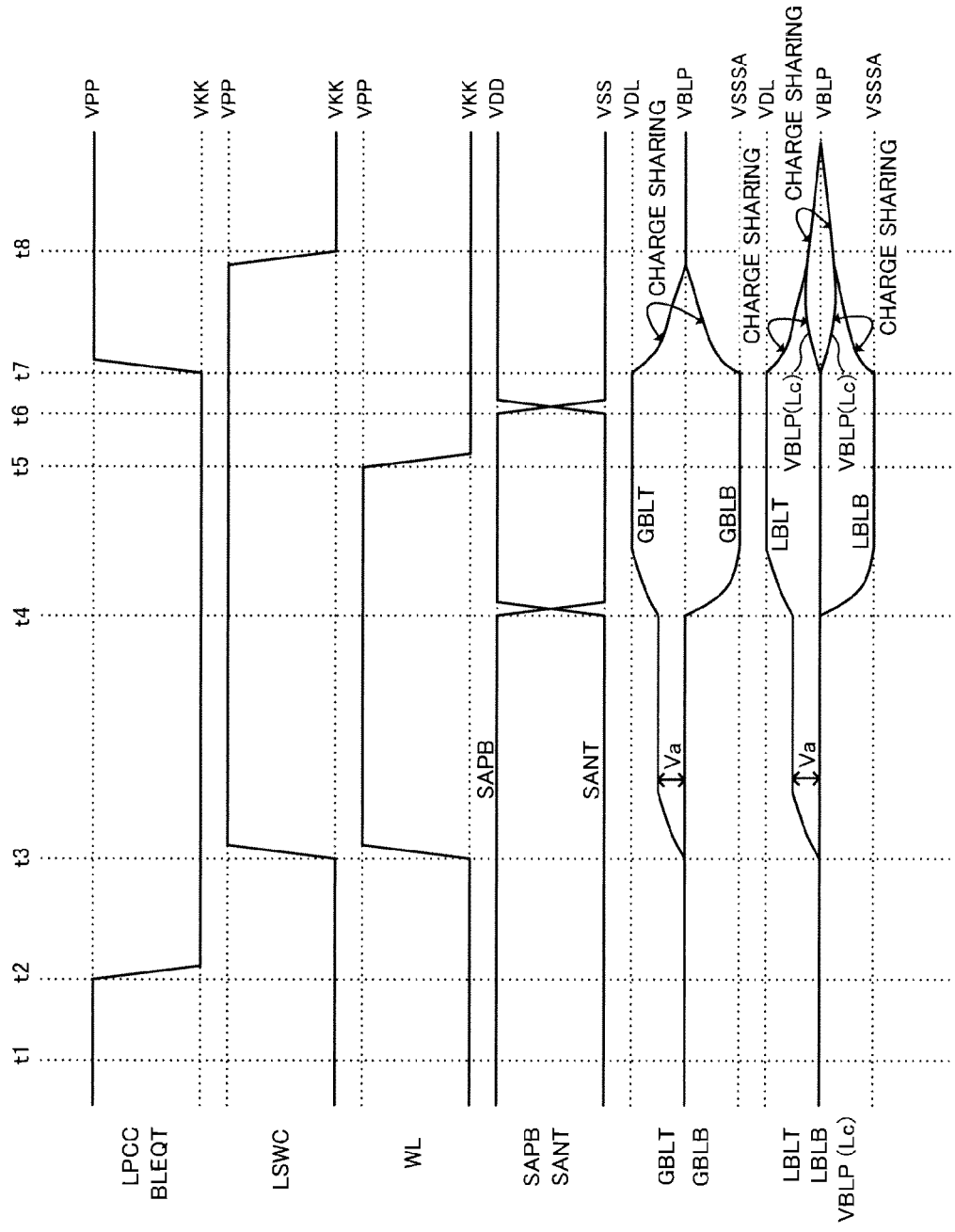
FIG. 9 is a diagram showing operation waveforms when a control method of the embodiments is not applied as a comparison example.
Figure 10:
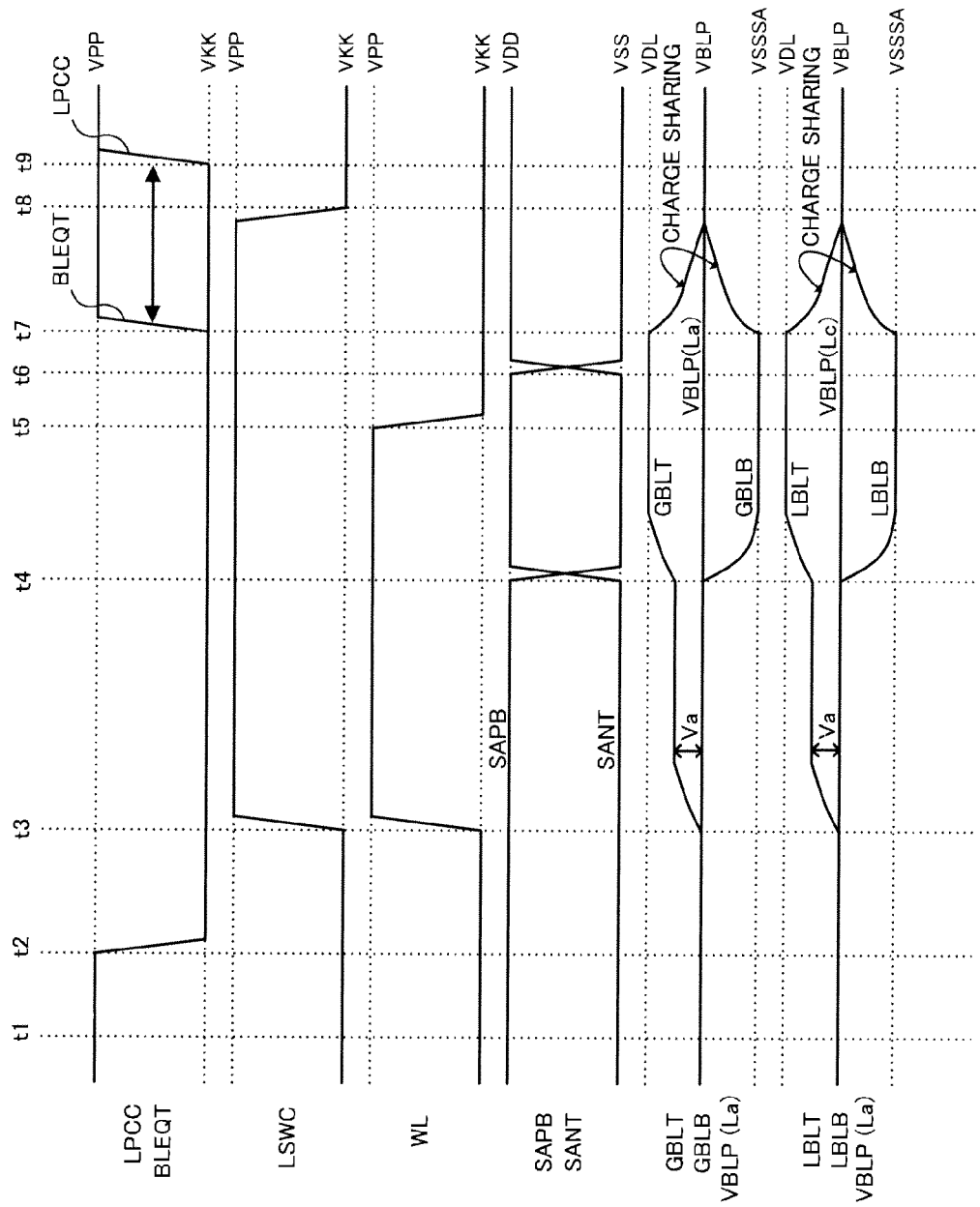
FIG. 10 is a diagram showing operation waveforms in case of applying the control method of the embodiments.

Next, a control method and operation waveforms of the DRAM of the embodiments will be described with reference to FIGS. 9 and 10. Regarding the DRAM having the configurations of FIGS. 1 to 8, FIG. 9 shows operation waveforms when the control method of the embodiments is not applied, which is shown as a comparison example relative to the embodiments, and FIG. 10 shows operation waveforms in case of applying the control method of the embodiments. FIGS. 9 and 10 includes waveforms of various control signals and waveforms of potentials of hierarchical bit lines, which are obtained during a period when the DRAM in a standby state waiting for accessing memory cells MC transitions to an active state and thereafter returns to the standby state again.

Here, each of FIGS. 9 and 10 shows a waveform of a global bit line GBLT belonging to the memory cell array ARY including a selected word line WL being driven for accessing (hereinafter, referred to as "selected memory cell array ARY"), and a waveform of a global bit line GBLB belonging to the memory cell array ARY arranged opposite to the selected memory cell array ARY across the sense amplifier array SAA therebetween (hereinafter, referred to as "reference memory cell array ARY"). Each sense amplifier SA of the sense amplifier array SAA between the selected memory cell array ARY and the reference memory cell array ARY (hereinafter, referred to as "selected sense amplifier array SAA") receives singles of a pair of the global bit lines GBLT and GBLB. Further, each of FIGS. 9 and 10 shows a waveform of a local bit line LBLT belonging to the sub-array SARY including the selected word line WL in the selected memory cell array ARY (hereinafter, referred to as "selected sub-array SARY") and a waveform of a local bit line LBLB belonging to a sub-array SARY at a symmetrical position with respect to the selected sub-array SARY in the reference memory cell array ARY (hereinafter, referred to as "reference sub-array SARY").

The waveforms from timing t1 to timing t7 in FIGS. 9 and 10 are the same as each other, and thus the following descriptions are common to both figures. First, at the timing t1 when the DRAM is in the standby state, the global bit lines GBLT, GBLB and the local bit lines LBLT, LBLB are respectively in a state of being precharged to the precharge voltage VBLP. Thereafter, the bit line equalization signal BLEQT is changed from HIGH to LOW at timing t2, and precharging of the global bit lines GBLT and GBLB is cancelled. At the same time timing, the precharge signal LPCC is changed from HIGH to LOW, and precharging of the local bit lines LBLT and LBLB is cancelled. At this point, the global bit lines GBLT, GBLB and the local bit lines LBLT, LBLB that have been maintained at the precharge voltage VBLP enter a floating state respectively.

Next, the selected word line WL is driven from LOW (voltage VKK as a negative potential) to HIGH (voltage VPP higher than an external potential) at timing t3. At the same timing, the connection control signal LSWC is changed from LOW to HIGH. Thereby, the local bit line LBLT and the global bit line GBLT in the selected memory cell array ARY become connected to each other via the switch circuit LSW, and the local bit line LBLB and the global bit line GBLB in the reference memory cell array ARY become connected to each other via the switch circuit LSW. Then, data stored in the data storage node SN of the memory cell MC connected to the selected word line WL is read out to the local bit line LBLT by charge sharing, the potential of the local bit line LBLT rises to a predetermined potential from the precharge voltage VBLP, and an initial voltage difference Va occurs between a pair of the local bit lines LBLT and LBLB. The voltage difference Va has a value obtained by subtracting a potential level of the local bit line LBLB from a potential level of the local bit line LBLT. At this point, potentials of a pair of the global bit lines GBLT and GBLB behave in a similar manner so that the same voltage difference Va occurs.

Subsequently, the respective sense amplifiers SA of the sense amplifier array SAA are activated at timing t4 by inverting the control signals SAPB and SANT supplied to the driver circuit CSD (FIG. 7) in the cross area XP. In the cross-coupled circuit CC of the sense amplifier SA, when the voltage difference Va is a positive value, the global bit line GBLT is driven to the power supply voltage VDL and the global bit line GBLB is driven to the ground potential VSSSA. On the other hand, when the voltage difference Va is a negative value, the global bit line GBLT is driven to the ground potential VSSSA and the global bit line GBLB is driven to the power supply voltage VDL. At this point, the local bit lines LBLT and LBLB are driven in a similar manner.

In FIGS. 9 and 10, it is assumed that all the global bit lines GBLT in the selected memory cell array ARY and all the local bit lines LBLT in the selected sub-array SARY are driven to the power supply voltage VDL respectively.

Next, the selected word line WL is returned from HIGH to LOW at timing t5 in the precharge period. As a result, the memory cell MC connected to the selected word line WL is disconnected from the local bit line LBLT. Subsequently, the respective sense amplifiers SA of the sense amplifier array SAA return to an inactive state at timing t6 in the precharge period by inverting the control signals SAPB and SANT again, and the driven state of the global bit lines GBLT and GBLB by the cross-coupled circuit CC is cancelled.

Subsequently, the bit line equalization signal BLEQT is returned from LOW to HIGH at timing t7 in the precharge period. Thereby, the global bit lines GBLT and GBLB that have been in the floating state are brought into a conductive state by the precharge circuit PCC of the sense amplifier SA and precharged to the precharge voltage VBLP again by charge sharing. Meanwhile, controls applied to the precharge signal LPCC at the timing t7 are different in FIGS. 9 and 10, and thus operations thereof will be separately described.

First, regarding the operation waveforms of FIG. 9 (comparison example), the precharge signal LPCC is returned from LOW to HIGH at the timing t7 similarly as the bit line equalization signal BLEQT. Thereby, the local bit lines LBLT and LBLB are connected to the lines Lc (FIG. 8) for the precharge voltage VBLP by the precharge circuit LPC. At this point, when the bit line equalization signal BLEQT and the precharge signal LPC are changed from LOW to HIGH at extremely close timings, the precharge voltage VBLP is supplied to the lines Lc having the higher resistance, as described in FIG. 8, and thus there arises a problem that the potential levels of the lines Lc become unstable due to charge sharing with the local bit lines LBLT and LBLB. That is, it can be found in FIG. 9 that the potential of the lines Lc transmitting the precharge voltage VBLP is shifted slightly upward on the side of one local bit line LBLT and is shifted slightly downward on the side of the other local bit line LBLB.

Next, the connection control signal LSWC is returned from HIGH to LOW at timing t8. Thereby, the switch circuit LSW becomes non-conductive and the local bit line LBLT (LBLB) and the global bit line GBLT (GBLB) are disconnected from each other. Meanwhile, since the level of the precharge voltage VBLP becomes unstable at the timing t8, as described above, the potential of the local bit line LBL has not converged to the precharge voltage VBLP. That is, it takes a long time to stabilize the potential of the local bit line LBL to the precharge voltage VBLP, which is caused by potential fluctuation of the lines Vc for the precharge voltage VBLP, thereby reducing precharging speed.

In contrast, in the operation waveforms of FIG. 10, only the bit line equalization signal BLEQT is returned from LOW to HIGH at the timing t7, and the precharge signal LPCC is maintained at LOW. Thus, at this point, the precharge operation for the global bit lines GBLT and GBLB are performed, while the precharge operation for the local bit lines LBLT and LBLB by the precharge circuit LPC are not performed. Then, the local bit lines LBLT and LBLB are precharged to the precharge voltage VBLP via the switch circuit LSW by the charge sharing through the global bit lines GBLT and GBLB. That is, it can be understood that the potential change after the timing t7 of the local bit lines LBLT and LBLB are the same as that of the global bit lines GBLT and GBLB. Since the precharge voltage VBLP is transmitted through the line La having the low resistance, its precharge time is shorter than that of FIG. 9 (comparison example). In this case, since the precharge circuit LPC is in a non-conductive state, it is possible to prevent a phenomenon in which the potential levels of the lines Lc for supplying the precharge voltage VBLP become unstable by the charge sharing like in FIG. 9.

Subsequently, the local bit line LBLT (LBLB) and the global bit line GBLT (GBLB) are disconnected from each other at the timing t8 (FIG. 10), by returning the connection control signal LSWC from HIGH to LOW. As different from the comparison example of FIG. 9, the potential fluctuation caused by the charge sharing with the lines Vc for supplying the precharge voltage VBLP has not occurred at this point, and the potential of the lines Vc is at the predetermined precharge voltage VBLP. Therefore, the precharge circuit LPC precharges the local bit lines LBLT and LBLB, which have almost converged to the precharge voltage VBLP, to the predetermined precharge voltage VBLP. Thus, the precharge circuit LPC has an effect of assisting the precharge circuit PCC by precharging the local bit lines LBLT and LBLB to the predetermined precharge voltage VBLP. Thereafter, the precharge signal LPCC is returned from LOW to HIGH at timing t9, and the local bit lines LBLT and LBLB are connected to the lines Lc (FIG. 8) for the precharge voltage VBLP by the precharge circuit LPC. Since the potentials of the local bit lines LBLT and LBLB have converged to the predetermined precharge voltage VBLP at this point, the precharge voltage VBLP is thereafter supplied to the local bit line LBL as a level keeper thereof in the standby state.

In this manner, the precharge signal LPCC is returned from LOW to HIGH at the timing t7 in the comparison example of FIG. 9, and in contrast, the control method of the embodiments has a feature that the precharge signal LPCC is returned from LOW to HIGH at the delayed timing t9 when the predetermined time elapses from the timing t7. However, the local bit lines LBLT and LBLB reach the predetermined precharge voltage VBLP earlier than the comparison example. In this case, the switch circuit LSW remains in a conductive state until the local bit lines LBLT and LBLB almost converge to the precharge voltage VBLP. By such a control, it is possible to avoid the problem of the potential fluctuation shown in FIG. 9. Accordingly, when supplying the precharge voltage VBLP using the lines Vc having the high resistance, the precharge operation for the local bit lines LBL can be performed with higher speed than the comparison example of FIG. 9.

Figure 11:
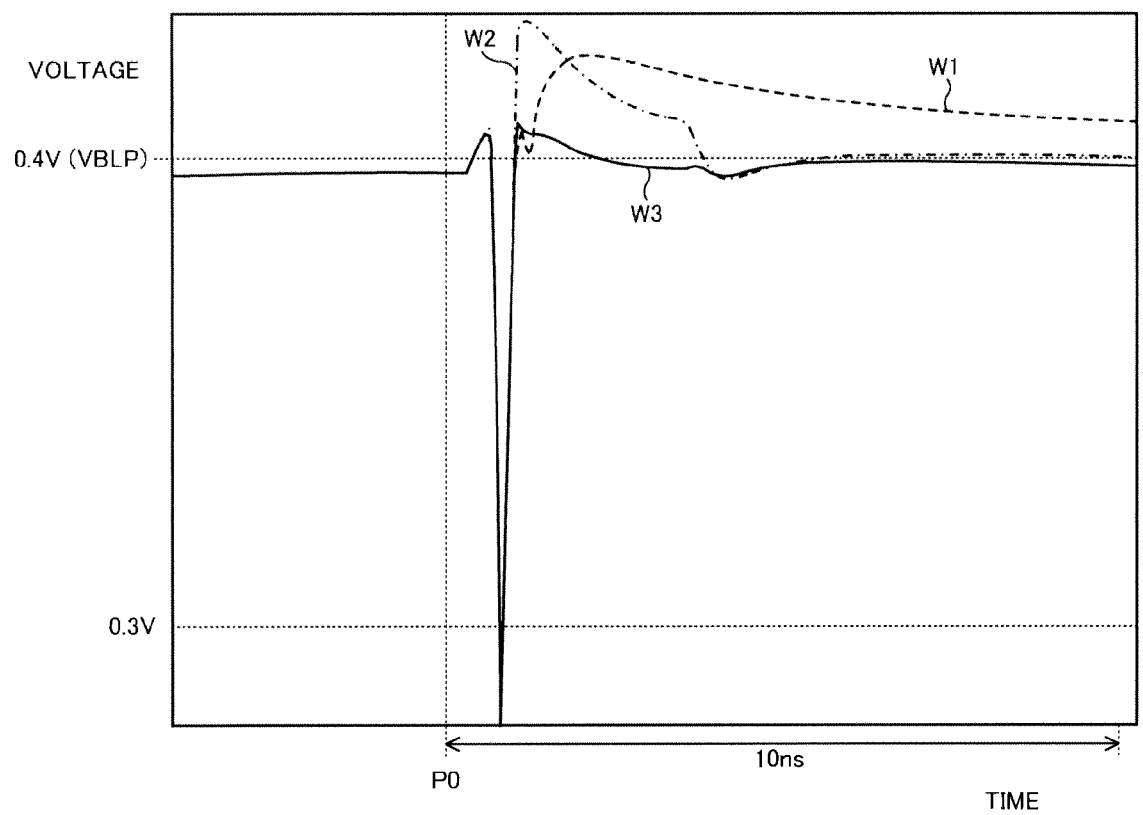
FIG. 11 is a diagram showing simulation results in relation to specific effects of the control method of the embodiments.

Next, specific effects of the control method of the embodiments will be described with reference to simulation results shown in FIG. 11. FIG. 11 show three types of operation waveforms of the precharge voltage VBLP (the lines Lc) obtained by simulation, regarding behavior of the precharge voltage VBL when the precharge operation of the memory cell array 10 is started. The simulation of FIG. 11 assumes first and second control methods in order to compare with the control method of the embodiments. In the first control method, the connection control signal LSWC is set to LOW (the switch circuit LSW enters an OFF state), and both the bit line equalization signal BLEQT and the precharge signal LPCC are set to HIGH (both the precharge circuits PCC and LPC are in an active state), at the timing t7 of FIG. 10. In the second control method (control method corresponding to FIG. 9), the connection control signal LSWC is maintained at HIGH (the switch circuit LSW is on) and both the bit line equalization signal BLEQT and the precharge signal LPCC are set to HIGH, at the timing t7 of FIG. 10.

FIG. 11 shows a waveform W1 corresponding to the first control method, a waveform W2 corresponding to the second control method, and a waveform W3 corresponding to the control method of the embodiments, which are overlapped with one another, when the precharge voltage VBLP is set to 0.4V. All of these waveforms include an instantaneous voltage drop due to ON-control of the precharge circuit LPC, which is slightly delayed from a starting point P0 (timing t7 of FIG. 10) of the precharge operation. Thereafter, in a recovery operation in which the precharge voltage VBLP returns to the original level, each of the waveforms W1 and W2 has a rise in potential, and on the other hand, the waveform W3 has little rise in potential. This is due to the difference of the potential fluctuation by the charge sharing described using FIGS. 9 and 10, and it is confirmed that the control method of the embodiments is advantageous for stabilizing the voltage VBLP.

In addition, the present invention can be applied to memory cell arrays ARY having various configurations, without being limited to the memory cell array ARY disclosed in the above embodiments. For example, although one precharge switch (one NNOS transistor in the precharge circuit LPC) is disposed at an end of one local bit line LBL in the embodiments, the one precharge switch may be disposed at the center of one local bit line LBL. One hierarchical switch (one NNOS transistor in the switch circuit LSW) may be the same. That is, one hierarchical switch and one precharge switch may be disposed at arbitrary positions of one local bit line LBL. Further, in FIG. 5, for example, the one hierarchical switch and the one precharge switch are respectively provided for the one local bit line LBL. However, without being limited to this, two or more hierarchical switches and two or more precharge switches may be provided for the one local bit line LBL. In this case, one hierarchical switch and one precharge switch may be provided for each of both ends of the local bit line LBL. Furthermore, one local sense amplifier may be disposed at an end of the one local bit line LBL. For example, the local sense amplifier disposed in this manner can be used for amplifying a signal voltage of the local bit line LBL in a restoring operation for the memory cells MC.

In the foregoing, the preferred embodiments have been described. The invention can be widely applied to semiconductor devices comprising a memory cell array having a hierarchical bit line structure in which, for example, volatile or nonvolatile memory cells are provided. Further, various circuit configurations can be employed in circuits included in the semiconductor device of the invention without being limited to the circuit configurations disclosed in the embodiments.

The invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the invention can be applied to various devices such as SOC (System on Chip), MCP (Multi Chip Package) and POP (Package on Package) and the like.

Further, transistors used for the invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor. Note that, in the embodiments, if the first conductive type transistor is replaced with the second conductive type transistor, the potential relation of control signals needs to be reversed in level.

The invention can be applied to devices based on various combinations or selections of the disclosure of the embodiments. That is, the invention covers various modifications which those skilled in the art can carry out in accordance with all disclosures including claims and technical ideas.

The invention claimed is:

1. A semiconductor device comprising a memory cell array having a hierarchical bit line structure, the device comprising:
a first global bit line;
a first local bit line corresponding to the first global bit line;
a first hierarchical switch controlling an electrical connection between the first global bit line and the first local bit line;
a sense amplifier amplifying a signal voltage of the first global bit line;
a precharge voltage generating circuit generating a precharge voltage;
a first precharge circuit supplying the precharge voltage to the first global bit line, the precharge voltage being supplied from the precharge voltage generating circuit through a first line;
a second precharge circuit supplying the precharge voltage to the first local bit line, the precharge voltage being supplied from the precharge voltage generating circuit through a second line; and
a control circuit controlling the first hierarchical switch, and the first and second precharge circuits;
wherein, in a precharge operation of the first local bit line and the first global bit line that are in a state of being electrically connected to each other through the first hierarchical switch, the control circuit is configured to activate the first precharge circuit so that while the first precharge circuit is activated, the precharge voltage is supplied to the first global bit line through the first line and is supplied to the first local bit line through the first global bit line and the first hierarchical switch, and after a lapse of a predetermined time from when the precharge voltage is supplied to the first local bit line through the first global bit line and the first hierarchical switch, the control circuit is configured to activate the second precharge circuit so that the precharge voltage is supplied to the first local bit line through the second line,
and the predetermined time is set to a time necessary from activation of the first precharge circuit until a potential of the first local bit line converges to the precharge voltage,
wherein the control circuit is configured to electrically disconnect between the first global bit line and the first local bit line h inactivating the first hierarchical switch prior to activating the second precharge circuit after the lapse of the predetermined time.

2. The semiconductor device according to claim 1, wherein the second line has a resistance larger than that of the first line.

3. The semiconductor device according to claim 2, wherein the second line includes the first line.

4. The semiconductor device according to claim 2, wherein the second line is formed in a layer below the first line.

5. The semiconductor device according to claim 4,
wherein the first line is formed of material having a first sheet resistance,
and the second line is formed of material having a second sheet resistance larger than that of the first sheet resistance.

6. The semiconductor device of claim 1, wherein the second precharge circuit is inactive as the precharge voltage is supplied to the first local bit line through the global bit line and the first hierarchical switch while the first precharge circuit is activated.

7. The semiconductor device of claim 1, wherein the first precharge circuit is still active after the first hierarchical switch is inactivated.

8. The semiconductor device of claim 1, wherein the first precharge circuit is still active after the second precharge circuit is activated.

9. A device comprising:
a global bit line;
a local bit line;
a plurality of memory cells each coupled to the local bit line;
a first precharge circuit configured to supply, when activated, a first precharge voltage to the global bit line while turning a switch configured to electrically connect the global bit line and the local bit line ON so that the local bit line is supplied with the first precharge voltage through the global bit line and the switch; and
a second precharge circuit configured to supply, when activated, a second precharge voltage to the local bit line after a lapse of a predetermined time from when the local bit line is supplied with the first precharge voltage through the global bit line and the switch, and the predetermined time is set to a time necessary from activation of the first precharge circuit until a potential of the local bit line converges to the first precharge voltage, wherein the switch is turned OFF when the second precharge switch is being activated.

10. The device according to claim 9, wherein the first precharge circuit is activated prior to activating the second precharge circuit.

11. The device according to claim 9, wherein the local bit line includes a first end portion and a second end portion, the switch being connected between the first end portion of the local bit line and the global bit line, the second precharge circuit including a voltage line that is connected to the second end portion of the local bit line to convey the second precharge voltage thereto.

12. The device according to claim 11, wherein each of the global bit line and the local bit line is elongated in a first direction and the voltage line is elongated in a second direction that crosses the first direction.

13. The device according to claim 9, further comprising a sense amplifier coupled to the global bit line, the first precharge circuit being disposed adjacently to the sense amplifier.

14. The method of claim 13, wherein the second precharge circuit is inactive as the local bit line receives the first precharge voltage through the global bit line and the switch while the first precharge switch is activated.

15. The method of claim 13, wherein the first precharge circuit is still active when the switch is turned OFF.

16. The semiconductor device of claim 9, wherein the econd precharge circuit is inactive as the first precharge circuit is activated to supply the local bit line with the first precharge voltage.

17. The semiconductor device of claim 9, wherein the first precharge circuit is still active after the switch is turned off.

18. A method comprising:
turning a switch ON to electrically connect a global bit line and a local bit line to each other;
activating a first precharge circuit to supply a first precharge voltage to the global bit line so that the local bit line receives the first precharge voltage through the global bit line and the switch while the first precharge switch is activated;
activating a second precharge circuit to supply a second precharge voltage to the local bit line after a predetermined period of time elapses from the supplying the first precharge voltage through the global bit line and the switch,
and the predetermined period of time is set to a time necessary from supplying the first precharge circuit until a potential of the local bit line converges to the first precharge voltage; and
turning the switch OFF prior to the supplying the second precharge voltage.

19. The method according to claim 18, further comprising turning an additional switch ON to electrically connect an global bit line and an additional local bit line to each other, the supplying the first precharge voltage to the first global bit line including supplying the first precharge voltage to the additional global bit line.

20. The method according to claim 19 further comprising supplying the second precharge voltage to the additional local bit line substantially simultaneously with the supplying the second precharge voltage to the local bit line.

* * * * *